US012805143B2

(12) United States Patent
Lee et al.

(10) Patent No.: US 12,805,143 B2
(45) Date of Patent: Nov. 17, 2026

(54) DISPLAY APPARATUS AND METHOD OF MANUFACTURING THE SAME

(71) Applicant: Samsung Display Co., Ltd., Yongin-Si (KR)

(72) Inventors: Seonuk Lee, Yongin-si (KR); Kanguk Kim, Yongin-si (KR); Yeogeon Yoon, Yongin-si (KR); Donchan Cho, Yongin-si (KR); Kangsoo Han, Yongin-si (KR); Taehyung Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 666 days.

(21) Appl. No.: 17/831,275

(22) Filed: Jun. 2, 2022

(65) Prior Publication Data

US 2023/0172024 A1 Jun. 1, 2023

(30) Foreign Application Priority Data

Nov. 26, 2021 (KR) ........................ 10-2021-0166192

(51) Int. Cl.

| | |
|---|---|
| ***H10K 59/38*** | (2023.01) |
| ***G02B 5/02*** | (2006.01) |
| ***H10K 71/00*** | (2023.01) |
| *G02B 5/20* | (2006.01) |
| *H10K 59/12* | (2023.01) |
| *H10K 59/122* | (2023.01) |

(52) U.S. Cl.

CPC ........... *H10K 59/38* (2023.02); *G02B 5/0242* (2013.01); *H10K 71/00* (2023.02); *G02B 5/201* (2013.01); *H10K 59/1201* (2023.02); *H10K 59/122* (2023.02)

(58) Field of Classification Search

None

See application file for complete search history.

(56) References Cited

U.S. PATENT DOCUMENTS

| | | | |
|---|---|---|---|
| 9,461,098 | B2 | 10/2016 | Choi et al. |
| 9,748,317 | B2 | 8/2017 | Kim et al. |
| 11,088,347 | B2 | 8/2021 | Lee et al. |

(Continued)

FOREIGN PATENT DOCUMENTS

| | | |
|---|---|---|
| KR | 10-2007-0049172 A | 5/2007 |
| KR | 10-2016-0032742 A | 3/2016 |

(Continued)

*Primary Examiner* — Sarah K Salerno

(74) *Attorney, Agent, or Firm* — Innovation Counsel LLP

(57) ABSTRACT

A display apparatus includes a substrate, a first display element, a first bank, a first functional layer, and a dummy unit. The first display element overlaps a face of the substrate. The first functional layer overlaps the first display element, is confined by at least the first bank, and includes a first base resin, first quantum dots, and first scatterers. The dummy unit overlaps no display elements of the display apparatus in a direction perpendicular to the face of the substrate and includes a first wall, a dummy-unit base resin, and dummy-unit scatterers. The dummy-unit base resin and the dummy-unit scatterers are confined by at least the first wall. A concentration of the dummy-unit scatterers in the dummy-unit base resin is greater than a concentration of the first scatterers in the first base resin.

10 Claims, 16 Drawing Sheets

(56) References Cited

U.S. PATENT DOCUMENTS

| | | | | |
|---|---|---|---|---|
| 11,163,195 | B2 | 11/2021 | Lee et al. | |
| 2005/0260335 | A1* | 11/2005 | Kimura | H10K 59/35 427/164 |
| 2008/0036367 | A1 | 2/2008 | Eida et al. | |
| 2020/0287103 | A1* | 9/2020 | Maegawa | H10H 20/8516 |
| 2021/0202587 | A1* | 7/2021 | Kim | H10K 50/844 |
| 2021/0320150 | A1* | 10/2021 | Yang | H10K 59/8792 |

FOREIGN PATENT DOCUMENTS

| | | | |
|---|---|---|---|
| KR | 10-2016-0032749 | A | 3/2016 |
| KR | 10-2223421 | B1 | 3/2021 |
| KR | 10-2021-0086791 | A | 7/2021 |
| TW | I679792 | B | 12/2019 |

* cited by examiner

DISPLAY APPARATUS AND METHOD OF MANUFACTURING THE SAME

CROSS-REFERENCE TO RELATED APPLICATION

This application claims priority under 35 U.S.C. § 119 to Korean Patent Application No. 10-2021-0166192 filed on Nov. 26, 2021 in the Korean Intellectual Property Office; the Korean Patent Application is incorporated by reference.

BACKGROUND

1. Field

The technical field is related to a display apparatus and a method of manufacturing the display apparatus.

2. Description of the Related Art

Display apparatuses may display images in response to input signals. Display apparatuses are included in various electronic devices, such as mobile phones and televisions.

A display apparatus may include pixels that emit light to display an image. The pixels may emit light of different colors.

SUMMARY

One or more embodiments may be related to a display apparatus in which the display area may not include a significant amount of unwanted stains. One or more embodiment may be related to a method of manufacturing the display apparatus.

According to one or more embodiments, a display apparatus includes a lower substrate, a display element disposed on the lower substrate and including an emission layer, an upper substrate disposed on the lower substrate with the display element between the upper substrate and the lower substrate and including a display area corresponding to the display element and a peripheral area around the display area, a plurality of banks arranged on a lower surface of the upper substrate in the display area, a first functional layer disposed between the plurality of banks and including a first base resin, a first quantum dot, and a first scatterer, and a dummy unit disposed in the peripheral area and including an external partition wall, a dummy-base resin, and a dummy-scatterer. The dummy-base resin and the dummy-scatterer may be disposed in a region surrounded by the external partition wall, and a concentration of the dummy-scatterer included in the dummy-base resin may be greater than a concentration of the first scatterer included in the first base resin.

The display apparatus may further include an internal partition wall configured to split an inside of the dummy unit, and the dummy unit may include sub-dummy units defined by the internal partition wall.

According to an embodiment, a shape and an area of at least one of the sub-dummy units may be the same as a shape and an area of the first functional layer.

The external partition wall may have a rectangular planar shape.

The external partition wall may include an opening, and the opening may be disposed on an edge of the upper substrate.

The display apparatus may further include a second functional layer disposed between the plurality of banks and including a second base resin, a second quantum dot, and a second scatterer, and a third functional layer disposed between the plurality of banks and including a third base resin and a third scatterer. The concentration of the dummy-scatterer included in the dummy-base resin may be greater than a concentration of the second scatterer included in the second base resin or a concentration of the third scatterer included in the third base resin.

The dummy unit may include a dummy-quantum dot, and a concentration of the dummy-quantum dot included in the dummy-base resin may be greater than a concentration of the first quantum dot included in the first base resin.

The display element may emit light of the same color.

The display apparatus may further include a first capping layer disposed between the upper substrate and the first functional layer and between the upper substrate and the dummy unit.

The display apparatus may further include a second capping layer disposed on the first functional layer and the dummy unit.

According to one or more embodiments, a method of manufacturing a display apparatus includes forming an external partition wall in a peripheral area located on an upper substrate and defining an area other than a display area, forming a plurality of banks on the upper substrate, forming a dummy unit by arranging a dummy-base resin and a dummy-scatterer on a region surrounded by the external partition wall, and forming a first functional layer between the plurality of banks, the first functional layer including a first base resin, a first quantum dot, and a first scatterer. A concentration of the dummy-scatterer included in the dummy-base resin may be greater than a concentration of the first scatterer included in the first base resin.

The method may further include splitting the dummy unit by forming an internal partition wall within the external partition wall, and the dummy unit may include sub-dummy units defined by the internal partition wall.

According to an embodiment, a shape and an area of at least one of the sub-dummy units may be the same as a shape and an area of the first functional layer.

The method may further include forming a second functional layer between the plurality of banks, the second functional layer including a second base resin, a second quantum dot, and a second scatterer, and forming a third functional layer between the plurality of banks, the third functional layer including a third base resin and a first scatterer, and the concentration of the dummy-scatterer included in the dummy-base resin may be greater than a concentration of the second scatterer included in the second base resin or a concentration of the third scatterer included in the third base resin.

The dummy unit and the first functional layer may be formed using an inkjet process, and inkjet coating may be performed by first applying ink to the dummy unit and then applying ink to the first functional layer.

The dummy unit may include a dummy-quantum dot, and a concentration of the dummy-quantum dot included in the dummy-base resin may be greater than a concentration of the first quantum dot included in the first base resin.

The method may further include forming a lower substrate, and forming a display element comprising an emission layer, on the lower substrate, and the display element may emit light of a same color.

The method may further include forming a first capping layer on lower surfaces of the plurality of banks and a lower surface of the first functional layer, on the upper substrate.

The method may further include forming a second capping layer that covers the plurality of banks, the first functional layer, and the dummy unit.

The method may further include cutting a portion or the entirety of the dummy unit along a cutting line arranged in the peripheral area.

An embodiment may be related to a display apparatus. The display apparatus may include a substrate, a first display element, a first bank, a first functional layer, and a dummy unit. The first display element may overlap a face of the substrate. The first bank may overlap the substrate. The first functional layer may overlap the first display element, may be confined by at least the first bank, and may include a first base resin, first quantum dots, and first scatterers. The dummy unit may overlap no display elements of the display apparatus in a direction perpendicular to the face of the substrate; i.e., the dummy unit may be spaced from all display elements of the display apparatus in a plan view of the display apparatus. The dummy unit may include a first wall, a dummy-unit base resin, and dummy-unit scatterers. The dummy-unit base resin and the dummy-unit scatterers may be confined by at least the first wall. A/the concentration of the dummy-unit scatterers in the dummy-unit base resin may be greater than a/the concentration of the first scatterers in the first base resin.

The display apparatus may include an internal partition wall that divides the dummy unit into sub-dummy units.

A shape and an area of at least one of the sub-dummy units may be the same as a shape and an area of the first functional layer in a plan view of the display device.

The dummy unit may have a rectangular shape in a plan view of the display apparatus.

The first functional layer may be disposed between the first display element and the substrate. The dummy unit may include an opening. The opening may be positioned at an edge of the substrate.

The display apparatus may include the following elements: a second display element; a third display element; a second functional layer overlapping the second display element and including a second base resin, second quantum dots, and second scatterers; and a third functional layer overlapping the third display element and including a third base resin and third scatterers. The concentration of the dummy-unit scatterers in the dummy-unit base resin may be greater than at least one of a/the concentration of the second scatterers in the second base resin and a/the concentration of the third scatterers in the third base resin.

The dummy unit may include dummy-unit quantum dots. A/the concentration of the dummy-unit quantum dots in the dummy-unit base resin may be greater than a/the concentration of the first quantum dots in the first base resin.

The display apparatus may include a second display element. No intervening display elements may be positioned between the first display element and the second display element. The color of light emitted by the second display element may be the same as the color of light emitted by the first display element.

The display apparatus may include a first cover layer disposed between the substrate and the first functional layer and between the substrate and the dummy unit. The first function layer may be disposed between the first display element and the substrate.

The display apparatus may include a second cover layer disposed directly on each of the first functional layer and the dummy unit.

An embodiment may be related to a method of manufacturing a display apparatus. The method may include the following steps: preparing a substrate; forming a first wall that overlaps a face of the substrate; forming a first bank that overlaps the face of the substrate; forming a dummy unit that includes a dummy-unit base resin and dummy-unit scatterers confined by at least the first wall; forming a first functional layer that includes a first base resin, first quantum dots, and first scatterers confined by at least the first bank; and positioning the first functional layer and a first display element to overlap each other. A/the concentration of the dummy-unit scatterers in the dummy-base resin may be greater than a/the concentration of the first scatterers in the first base resin. The dummy unit may overlap no display elements of the display apparatus in a direction perpendicular to the face of the substrate; i.e., the dummy unit is spaced from all display elements of the display apparatus in a plan view of the display apparatus.

The method may include forming an internal partition all that divides the dummy unit into sub-dummy units.

A shape and an area of at least one of the sub-dummy units may be the same as a shape and an area of the first functional layer in a plan view of the display apparatus.

The method may include the following steps: forming a second functional layer, wherein the second functional layer may include a second base resin, second quantum dots, and second scatterers; forming a third functional layer, wherein the third functional layer may include a third base resin, and third scatterers; positioning the second functional layer and a second display element to overlap each other; and positioning the third functional layer and a third display element to overlap each other. The concentration of the dummy-unit scatterers in the dummy-unit base resin may be greater than at least one of a/the concentration of the second scatterers in the second base resin and a/the concentration of the third scatterers in the third base resin.

The method may include applying ink to form the dummy unit before applying any ink to form the first functional layer.

The dummy unit may include dummy-unit quantum dots. A/the concentration of the dummy-unit quantum dots in the dummy-unit base resin may be greater than a/the concentration of the first quantum dots in the first base resin.

The method may include the following steps: forming the first display element; and forming a second display element. No intervening display elements may be positioned between the first display element and the second display element. The color of light emitted by the first display element may be the same as the color of light emitted by the second display element.

The method may include forming a first cover layer. The first cover layer may be positioned between the first bank and the substrate and between the first functional layer and the upper substrate.

The method may include forming a second cover layer. The second cover layer may directly contact each of the first bank, the first functional layer, and the dummy unit.

The method may include partially or completely removing the dummy unit when partially removing the substrate.

DETAILED DESCRIPTION

Figure 1:
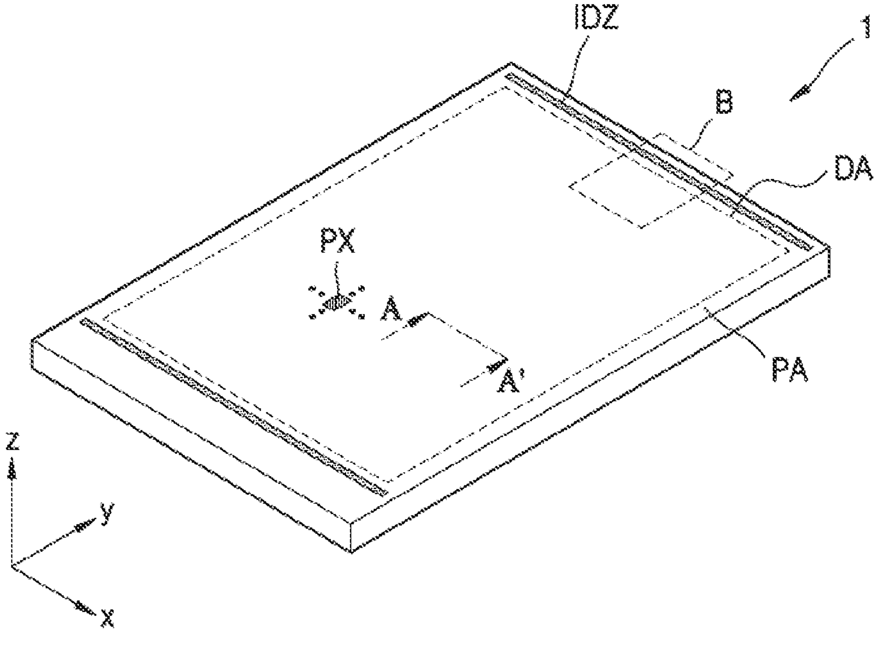
FIG. 1 is a schematic perspective view of a display apparatus according to an embodiment.

Examples of embodiments are described with reference to the accompanying drawings, wherein like reference numerals may refer to like elements. Practical embodiments may have different forms and should not be construed as being limited to the described embodiments.

An expression used in the singular may encompass the expression in the plural, unless the context clearly indicates otherwise.

Although the terms "first," "second," etc. may be used to describe various elements, the elements should not be limited by these terms. The terms are used to distinguish one element from another. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

Dimensions in the drawings may be exaggerated or reduced for convenience of explanation and may not limit embodiments.

Features of different embodiments may be partially or wholly combined.

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." intervening transistor." The term "insulate" may mean "electrically insulate" or "electrically isolate." The term "conductive" may mean "electrically conductive." The term "drive" may mean "operate" or "control." The term "include" may mean "be made of." The term "adjacent" may mean "immediately adjacent." The expression that an element extends in a particular direction may mean that the element extends lengthwise in the particular direction and/or that the lengthwise direction of the element is in the particular direction. The term "pattern" may mean "member." The term "defined" may mean "formed" or "provided." The expression that a space or opening overlaps an object may mean that (the position of) the space or opening overlaps with (the position of) the object. The term "overlap" may be equivalent to "be overlapped by." The expression that a first element overlaps with a second element in a plan view may mean that the first element overlaps the second element in direction perpendicular to a substrate. The term "capping" may mean "covering" or "cover." The term "on" may mean "indirectly on" or "directly on." The term "external partition wall" may mean "wall" or "surrounding wall." The term "dummy-base resin" may mean "dummy-unit base resin." The term "dummy-scatterer" may mean "dummy-unit scatterer." The term "dummy-quantum dot" may mean "dummy-unit quantum dot." The term "a concentration of scatters in a base resin" may mean "the quantity/volume/mass of scatters per unit volume of the base resin."

FIG. 1 is a schematic perspective view of a display apparatus 1 according to an embodiment.

Referring to FIG. 1, the display apparatus 1 may include a display area DA and a peripheral area PA. Pixels PX may be arranged in the display area DA for displaying an image. The peripheral area PA may surround at least a portion of the display area DA. No pixels PX may be arranged in the peripheral area PA.

The pixels PX may be arranged in a two-dimensional (2D) array in the display area DA. Each of the pixels PX is an image unit capable of emitting light of a certain color, and the display apparatus 1 may provide an image using light emitted by the pixels PX.

The peripheral area PA includes no pixels for displaying images, and may entirely surround the display area DA. A driver, a main power line for providing an electrical signal or power to pixel circuits, pads that are electrically connected to an electronic device, and/or a printed circuit board (PCB) may be arranged in the peripheral area PA.

FIG. 1 illustrates that the display area DA is rectangular. The display area DA may have the shape of a circle, an oval, or a polygon such as a triangle. The display apparatus 1 may be flat and/or may be flexible, foldable, and/or rollable.

Each of the pixels PX may emit light of a predetermined color, for example, red, green, blue, or white.

A dummy unit IDZ may be arranged in the peripheral area PA. The dummy unit IDZ is where defective ink is previously discharged during an inkjet process, and may prevent corner stains and yellowing stains in the display area DA. The dummy unit IDZ may be longer than a shorter edge of the display area DA. One dummy unit IDZ may be arranged near one side of the display area DA. Two dummy unit IDZ may be respectively arranged near two opposite sides of the display area DA.

Figure 2:
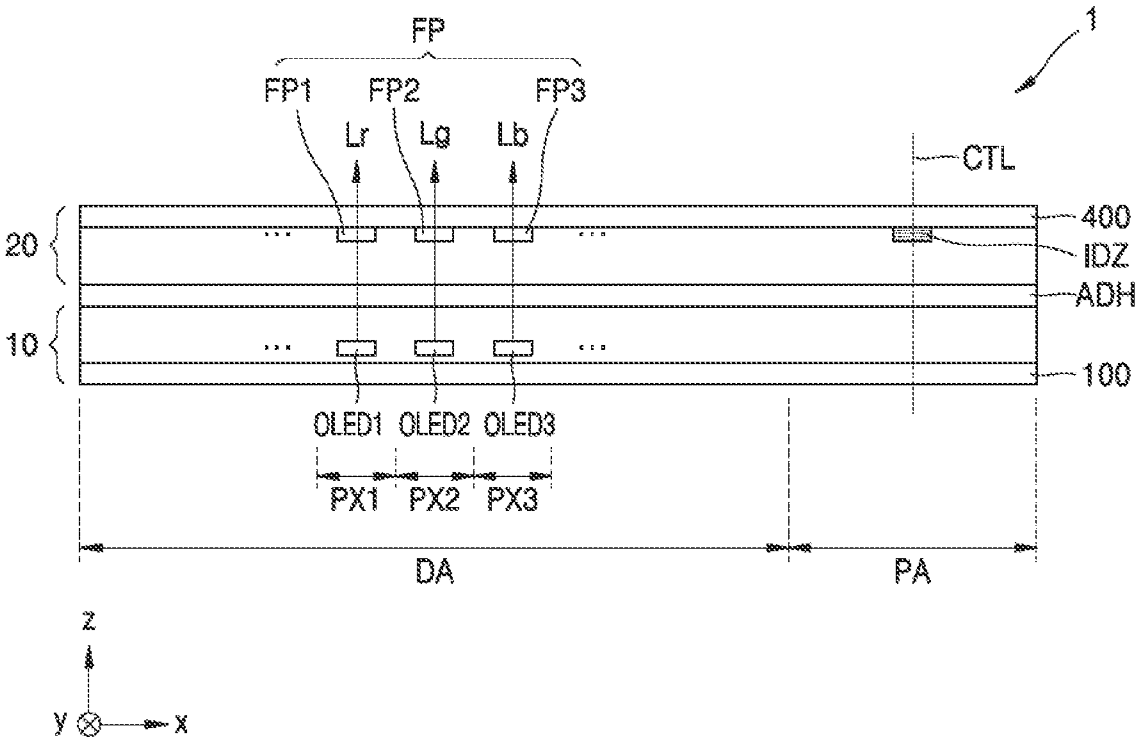
FIG. 2 is a schematic cross-sectional view illustrating a display apparatus according to an embodiment.
Figure 3:
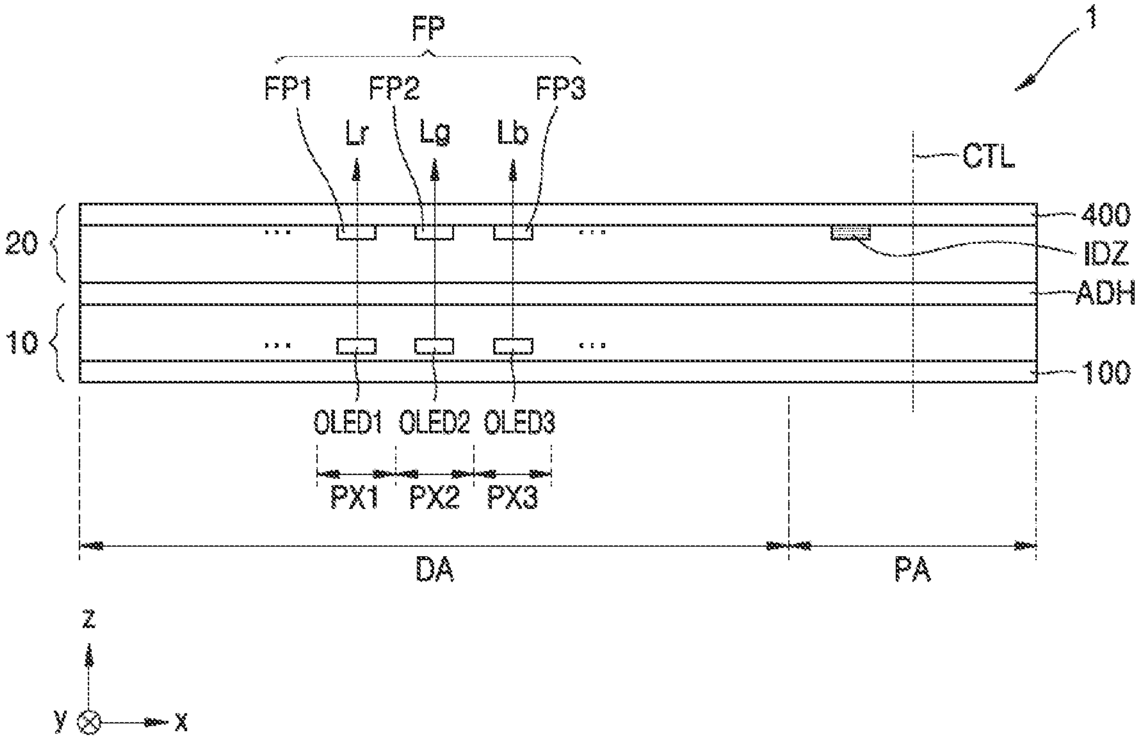
FIG. 3 is a schematic cross-sectional view illustrating a display apparatus according to an embodiment.

FIGS. 2 and 3 are schematic cross-sectional views illustrating display apparatuses 1 according to embodiments.

Referring to FIG. 2, the display apparatus 1 may include a display panel 10 and a color converting panel 20. The display panel 10 may include a lower substrate 100 and a display element. The display element may be, for example, an organic light-emitting diode. According to an embodiment, a first pixel PX1, a second pixel PX2, and a third pixel PX3 may include respective organic light-emitting diodes. The first pixel PX1 may include a first organic light-emitting diode OLED1. The second pixel PX2 may include a second organic light-emitting diode OLED2. The third pixel PX3 may include a third organic light-emitting diode OLED3. The display elements, i.e., organic light-emitting diodes OLED1, OLED2, and OLED3, may emit light of the same color or may light beams of three different colors.

The display apparatus 1 may include the first pixel PX1, the second pixel PX2, and the third pixel PX3. The first pixel PX1, the second pixel PX2, and the third pixel PX3 may emit light beams of different colors, respectively. The first pixel PX1 may emit red light Lr, the second pixel PX2 may emit green light Lg, and the third pixel PX3 may emit blue light Lb.

In the process of manufacturing the display apparatus 1, a cutting line CTL may be positioned in the peripheral area PA, and the peripheral area PA (including portions of the substrates 100 and 400) may be partially or entirely removed along the cutting line CTL. A dummy unit IDZ may be arranged on a lower surface of an upper substrate 400 in the peripheral area PA and may be partially or completely removed when the peripheral area PA is cut.

The first organic light-emitting diode OLED1, the second organic light-emitting diode OLED2, and the third organic light-emitting diode OLED3 may emit blue light Lb. The first organic light-emitting diode OLED1, the second organic light-emitting diode OLED2, and the third organic light-emitting diode OLED3 may emit red light Lr, green light Lg, and blue light Lb, respectively.

The color converting panel 20 may include the upper substrate 400 and a filter FP. The filter FP may include a first filter FP1, a second filter FP2, and a third filter FP3. Light emitted by the first organic light-emitting diode OLED1 may be emitted as the red light Lr by passing through the first filter FP1. Light emitted by the second organic light-emitting diode OLED2 may be emitted as the green light Lg by passing through the second filter FP2. Light emitted by the third organic light-emitting diode OLED3 may be emitted as the blue light Lb by passing through the third filter FP3.

The filter FP may include a functional layer including quantum dots and scatterers, and may include a color filter layer. The functional layer may include first quantum dots, second quantum dots, and a transmissive layer. The functional layer may include first scatterers, second scatterers, and third scatterers. The color filter layer may include a first color filter, a second color filter, and a third color filter. The first filter FP1 may include first quantum dots and a first color filter. The second filter FP2 may include second quantum dots and a second color filter. The third filter FP3 may include a transmissive layer and a third color filter.

The filter FP may be disposed directly on the upper substrate 400. In the manufacturing of the color converting panel 20, the first color filter, the second color filter, and the third color filter may be formed directly on the upper substrate 400. The color converting panel 20 may be bonded with the display panel 10 such that the first filter FP1, the second filter FP2, and the third filter FP3 face the first organic light-emitting diode OLED1, the second organic light-emitting diode OLED2, and the third organic light-emitting diode OLED3, respectively.

Referring to FIG. 2, the display panel 10 and the color converting panel 20 are bonded with each other by an adhesive layer ADH. The adhesive layer ADH may be an optical clear adhesive (OCA). The display panel 10 and the color converting panel 20 may be bonded with each other by a filler. The adhesive layer ADH and the filler may be optional.

The upper substrate 400 may include glass, a metal, and/or a polymer resin. The upper substrate 400 may be flexible and/or bendable and may include a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The upper substrate 400 may have a multi-layered structure including two polymer layers and a barrier layer between the two polymer layers. The barrier layer may include an inorganic material, such as silicon oxide ($SiO_2$), silicon nitride ($SiN_x$), or silicon oxynitride (SiON).

In a process of bonding and then cutting the lower substrate 100 and the upper substrate 400 along the cutting line CTL, the peripheral area PA may be partially or completely removed.

The dummy unit IDZ includes dummy-scatterers, and may be arranged on the lower surface of the upper substrate 400 in the peripheral area PA. The dummy unit IDZ and the functional layer may be arranged directly on the same face of the upper substrate 400. An area surrounded by an external partition wall of the dummy unit IDZ may receive defective ink during an inkjet process. The dummy unit IDZ may prevent corner stains and yellowing stains in the display area DA. A concentration of the dummy-scatterers in the dummy-base resin (e.g., the amount/mass of dummy-scatters per unit volume of the dummy-base resin) may be greater than a concentration of the scatterers of the functional layer in the base resin of the functional layer (e.g., the amount/mass of functional layer scatters per unit volume of the functional layer base resin). The dummy unit IDZ may include quantum dots, and a concentration of the dummy-quantum dots in the dummy-base resin (e.g., the amount/mass of dummy-quantum dots per unit volume of the dummy-base resin) may be greater than a concentration of the quantum dots of the functional layer in the base resin of the functional layer (e.g., the amount/mass of functional layer quantum dots per unit volume of the functional layer base resin).

The dummy unit IDZ may be arranged beyond the cutting line CTL and may be completely removed after cutting. The dummy unit IDZ may be arranged on the cutting line CTL and may be partially removed after cutting.

Referring to FIG. 3, the dummy unit IDZ may be arranged between the display area DA and the cutting line CTL in the peripheral area PA. The dummy unit IDZ may remain on the lower surface of the upper substrate 400 even after the display apparatus 1 is cut along the cutting line CTL. As the dummy unit IDZ is arranged adjacent to the display area DA, the dummy unit IDZ may be utilized even when the upper substrate 400 has a small planar width.

Figure 4:
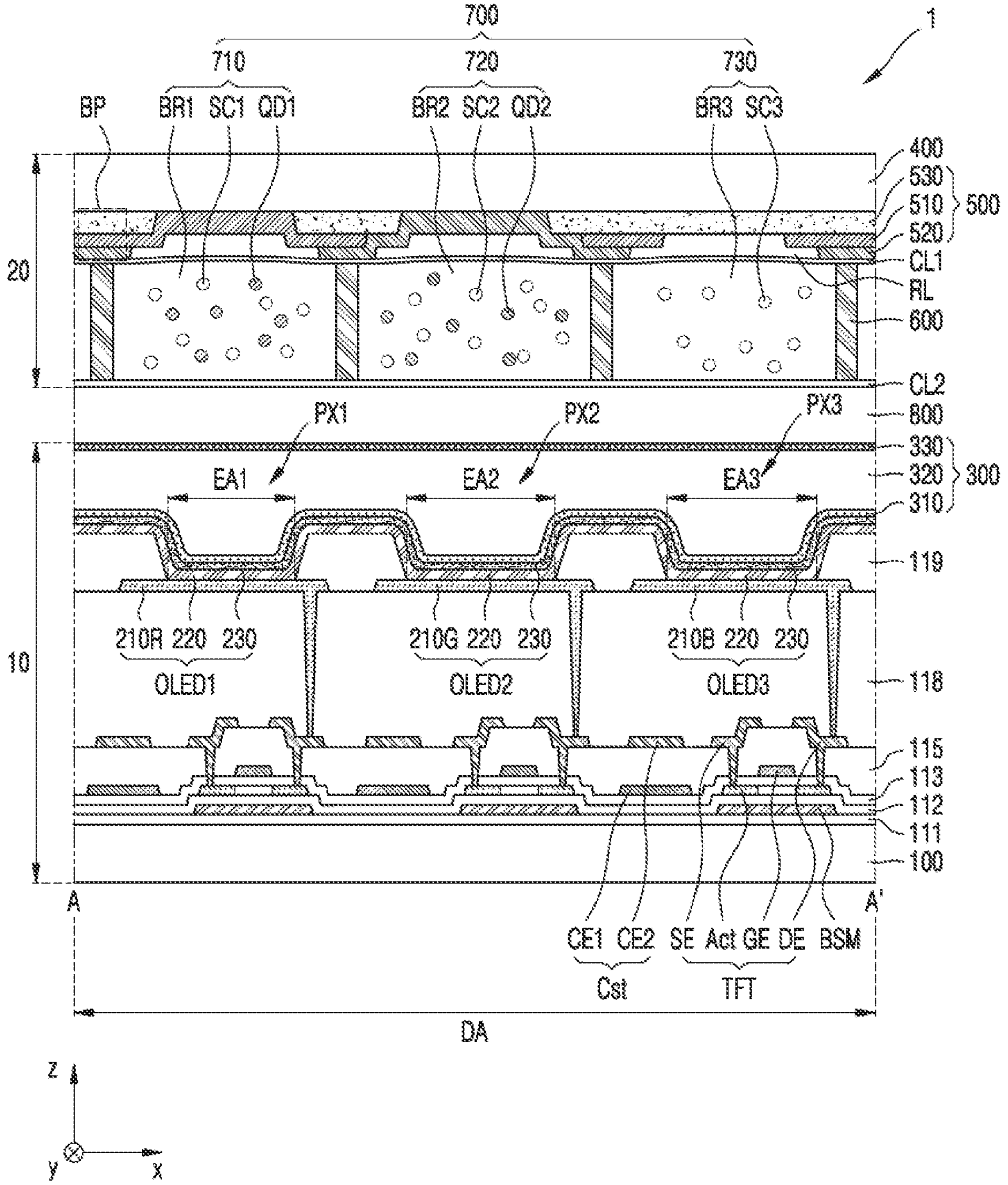
FIG. 4 is a schematic cross-sectional view of a display apparatus according to an embodiment.

FIG. 4 is a schematic cross-sectional view of the display apparatus 1 taken along line A-A' of FIG. 1 according to an embodiment. Some features illustrated in FIG. 4 are described with reference to one or more of FIG. 1, FIG. 2, and FIG. 3.

Referring to FIG. 4, the display apparatus 1 may include a first pixel PX1, a second pixel PX2, and a third pixel PX3 arranged in the display area DA. The display apparatus 1 may include more pixels. The first pixel PX1, the second pixel PX2, and the third pixel PX3 may or may not be immediately adjacent to one another.

The first pixel PX1, the second pixel PX2, and the third pixel PX3 may emit light beams of different colors. The first pixel PX1 may emit red light, the second pixel PX2 may emit green light, and the third pixel PX3 may emit blue light.

The display apparatus 1 may include a display panel 10 and a color converting panel 20. The display panel 10 may include a lower substrate 100 and a display element arranged on the lower substrate 100. The display element may include an emission layer 220. The display panel 10 may include a first organic light-emitting diode OLED1, a second organic light-emitting diode OLED2, and a third organic light-emitting diode OLED3 arranged on the lower substrate 100. The first organic light-emitting diode OLED1, the second organic light-emitting diode OLED2, and the third organic light-emitting diode OLED3 may include an emission layer 220.

The lower substrate 100 may include a glass material, a metal material, and/or a flexible or bendable material. The lower substrate 100 may be flexible or bendable and may include a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The lower substrate 100 may include a single-layered structure or a multiple-layered structure. The multi-layered structure may include an inorganic layer. The lower substrate 100 may have a stacked structure of an organic material layer, an inorganic material layer, and an organic material layer.

A barrier layer (not shown) may be included between the lower substrate 100 and a first buffer layer 111. The barrier layer may prevent or minimize infiltration of impurities from the lower substrate 100 and the like into a semiconductor layer Act. The barrier layer may include an inorganic material (such as oxide or nitride), an organic material, or an organic and inorganic compound, and may be/include a single layer or multiple layers.

A bias electrode BSM may be arranged on the first buffer layer 111 and may correspond to a thin-film transistor TFT. A voltage may be applied to the bias electrode BSM. The bias electrode BSM may prevent external light from reaching the semiconductor layer Act. Accordingly, characteristics of the thin-film transistor TFT may be sufficiently stable. The bias electrode BSM may be optional.

The semiconductor layer Act may be arranged on a second buffer layer 112. The semiconductor layer Act may include amorphous silicon or polysilicon. The semiconductor layer Act may include an oxide of at least one of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). The semiconductor layer Act may be formed of a Zn oxide-based material, such as Zn oxide, In—Zn oxide, or Ga—In—Zn oxide. The semiconductor layer Act may be an In—Ga—Zn—O (IGZO), In—Sn—Zn—O (ITZO), or In—Ga—Sn—Zn—O (IGTZO) semiconductor containing a metal, such as In, Ga, or Sn, in ZnO. The semiconductor layer Act may include a channel region, and may include a source region and a drain region respectively arranged on opposite sides of the channel region. The semiconductor layer Act may have a single-layer or multi-layer structure.

A gate electrode GE may be arranged on the semiconductor layer Act with an intervening gate insulating layer 113. At least a portion of the gate electrode GE may overlap the semiconductor layer Act. The gate electrode GE may include molybdenum (Mo), aluminum (Al), copper (Cu), or titanium (Ti), and may have a single layer or multi-layer structure. The gate electrode GE may be a single Mo layer. A first electrode CE1 of a storage capacitor Cst may be arranged on the same gate insulating layer 113 as the gate electrode GE. The first electrode CE1 may be formed of the same material as the gate electrode GE.

The gate electrode GE of the thin-film transistor TFT and the first electrode CE1 of the storage capacitor Cst may arranged separately, as illustrated in FIG. 4. The storage capacitor Cst may overlap the thin-film transistor TFT, and the gate electrode GE of the thin-film transistor TFT may function as the first electrode CE1 of the storage capacitor Cst.

An interlayer insulating layer 115 may cover the gate electrode GE and the first electrode CE1 of the storage capacitor Cst. The interlayer insulating layer 115 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

A second electrode CE2 of the storage capacitor Cst, a source electrode SE, and a drain electrode DE may be arranged on the interlayer insulating layer 115.

Each of the second electrode CE2 of the storage capacitor Cst, the source electrode SE, and the drain electrode DE may include a conductive material including at least one of molybdenum (Mo), aluminum (Al), copper (Cu), and titanium (Ti), and may be a multi-layer structure or single layer. For example, each of the second electrode CE2, the source electrode SE, and the drain electrode DE may have a multi-layer structure of Ti—Al—Ti. The source electrode SE and the drain electrode DE may be respectively connected to a source region and drain region of the semiconductor layer Act through contact holes.

The second electrode CE2 of the storage capacitor Cst may overlap the first electrode CE1 with the interlayer insulating layer 115 between the electrodes CE1 and CE2. The interlayer insulating layer 115 may function as a dielectric layer of the storage capacitor Cst.

A planarization layer 118 may be arranged on the second electrode CE2 of the storage capacitor Cst, the source electrode SE, and the drain electrode DE. The planarization layer 118 may have a single-layer or multi-layer structure, may include an organic material, and may provide a flat upper surface. The planarization layer 118 may include a commercial polymer (such as benzocyclobutene (BCB), polyimide, hexamethyldisiloxane (HMDSO), polymethyl methacrylate (PMMA), or polystyrene (PS)), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, and/or a blend of some of the above materials.

The display elements, including the first organic light-emitting diode OLED1, the second organic light-emitting diode OLED2, and the third organic light-emitting diode OLED3, may be arranged on the planarization layer 118. The first organic light-emitting diode OLED1, the second organic light-emitting diode OLED2, and the third organic light-emitting diode OLED3 may include a first pixel electrode 210R, a second pixel electrode 210G, and a third pixel electrode 210B, respectively. The first organic light-emitting diode OLED1, the second organic light-emitting diode OLED2, and the third organic light-emitting diode OLED3 may include portions of the emission layer 220 and portions of an opposite electrode 230.

Each of the first pixel electrode 210R, the second pixel electrode 210G, and the third pixel electrode 210B may be a (semi) light-transmissive electrode or a reflective electrode. Each of the first pixel electrode 210R, the second pixel electrode 210G, and the third pixel electrode 210B may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), and/or a compound/alloy of one or more of the above metals, and may include a transparent or semi-transparent electrode layer formed on the reflective layer. The transparent or semi-transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). Each of the first pixel electrode 210R, the second pixel electrode 210G, and the third pixel electrode 210B may have a structure of ITO-Ag-ITO.

A pixel defining layer 119 may be arranged on the planarization layer 118. The pixel defining layer 119 may include openings that expose center portions of the first pixel electrode 210R, the second pixel electrode 210G, and the third pixel electrode 210B, respectively. The pixel defining layer 119 may cover edges of the first pixel electrode 210R, the second pixel electrode 210G, and the third pixel electrode 210B, respectively. The pixel defining layer 119 may preventing an arc or the like from occurring at the respective edges of the first pixel electrode 210R, the second pixel electrode 210G, and the third pixel electrode 210B, by increasing distances between the respective edges of the first pixel electrode 210R, the second pixel electrode 210G, and the third pixel electrode 210B and the opposite electrode 230.

The pixel defining layer 119 may be formed of at least one organic insulating material, such as at least one of among polyimide, polyamide, acryl resin, benzocyclobutene, and a phenolic resin, by spin coating.

The emission layer 220 of the first organic light-emitting diode OLED1, the second organic light-emitting diode OLED2, and the third organic light-emitting diode OLED3 may include an organic material including a fluorescent or phosphorescent material that emits red, green, blue, or white light. The emission layer 220 may include a low molecular weight organic material or a high molecular weight organic material. One or more functional layers, such as a hole transport layer (HTL), a hole injection layer (HIL), an electron transport layer (ETL), and an electron injection layer (EIL), may be located below and above the emission layer 220. Although the emission layer 220 may be integrally formed to cover the first pixel electrode 210R, the second pixel electrode 210G, and the third pixel electrode 210B, as illustrated in FIG. 4, the emission layer 220 may include separate sections that respectively overlap the first pixel electrode 210R, the second pixel electrode 210G, and the third pixel electrode 210B.

The emission layer 220 may emit light in a first wavelength band from about 450 nm to about 495 nm.

The opposite electrode 230 may be a transparent or semi-transparent electrode, and may include a metal thin film having a small work function. The metal thin film may include at least one of lithium (Li), calcium (Ca), lithium fluoride/calcium (LiF/Ga), lithium fluoride/aluminum (LiF/Al), aluminum (Al), silver (Ag), magnesium (Mg), and a compound/alloy of one or more of the above materials. A transparent conductive oxide (TCO) layer including ITO, IZO, ZnO, and/or $In_2O_3$, may be arranged on the metal thin film.

First light may be generated hi a first emission area EA1 of the first organic light-emitting diode OLED1 and emitted to the outside. The first emission area EA1 may be a portion of the first pixel electrode 210R exposed by an opening of the pixel defining layer 119. Second light may be generated hi a second emission area EA2 of the second organic light-emitting diode OLED2 and emitted to the outside. The second emission area EA2 may be a portion of the second pixel electrode 210G exposed by an opening of the pixel defining layer 119. Third light may be generated in a third emission area EA3 of the third organic light-emitting diode OLED3 and emitted to the outside. The third emission area EA3 may be a portion of the third pixel electrode 210B exposed by an opening of the pixel defining layer 119.

The first emission area EA1, the second emission area EA2, and the third emission area EA3 may be spaced from one another. An area of the display area DA other than the first emission area EA1, the second emission area EA2, and the third emission area EA3 may be a non-emission area. The first emission area EA1, the second emission area EA2, and the third emission area EA3 may be spaced from one another by the non-emission area. In a plan view, the first emission area EA1, the second emission area EA2, and the third emission area EA3 may be arranged in a stripe layout or a PENTILE™ layout. In a plan view, each of the first emission area EA1, the second emission area EA2, and the third emission area EA3 may have a shape of at least one of a polygon, a circle, and an oval.

A spacer (not shown) for preventing damage by a mask may be arranged on the pixel defining layer 119. The spacer may be integrally formed with the pixel defining layer 119. The spacer and the pixel defining layer 119 may be simultaneously formed according to the same process by a half tone mask process.

Because the first organic light-emitting diode OLED1, the second organic light-emitting diode OLED2, and the third organic light-emitting diode OLED3 may be easily damaged by moisture, oxygen, or the like, the first organic light-emitting diode OLED1, the second organic light-emitting diode OLED2, and the third organic light-emitting diode OLED3 may be covered and protected by an encapsulation layer 300. The encapsulation layer 300 may cover the display area DA and extend beyond the display area DA. The encapsulation layer 300 may include at least one organic encapsulation layer and at least one inorganic encapsulation layer. The encapsulation layer 300 may include a first inorganic encapsulation layer 310, an organic encapsulation layer 320, and a second inorganic encapsulation layer 330.

The first inorganic encapsulation layer 310 is formed on an uneven structure and may have an uneven upper surface. The organic encapsulation layer 320 covers the first inorganic encapsulation layer 310 and may provide a substantially flat upper surface.

Each of the first inorganic encapsulation layer 310 and the second inorganic encapsulation layer 330 may include at least one inorganic material, such as at least one of aluminum oxide ($Al_2O_3$), titanium oxide ($TiO_2$), tantalum oxide ($Ta_2O_5$), hafnium oxide ($HfO_2$), zinc oxide (ZnO), silicon oxide ($SiO_2$), silicon nitride ($SiN_x$), and silicon oxynitride (SiON). The organic encapsulation layer 320 may include a polymer-based material. Examples of the polymer-based material may include an acrylic resin, an epoxy-based resin, polyimide, and polyethylene. The organic encapsulation layer 320 may include acrylate.

Even when cracks occur in the encapsulation layer 300 due to the multi-layered structure described above, the encapsulation layer 300 may not avow the cracks to be connected between the first inorganic encapsulation layer 310 and the organic encapsulation layer 320 or between the organic encapsulation layer 320 and the second inorganic encapsulation layer 330. Accordingly, external moisture, oxygen, and the like may not significantly permeate into the display area DA.

Although not shown in the drawings, as necessary, other layers, such as a capping layer, may be provided between the first inorganic encapsulation layer 310 and the opposite electrode 230.

The color converting panel 20 may include an upper substrate 400, a color filter layer 500, a refractive layer RL, a first capping layer CL1, a plurality of banks 600, a functional layer 700, and a second capping layer CL2. The upper substrate 400 may be disposed over the lower substrate 100 such that the display element may be between the upper substrate 400 and the lower substrate 100. The upper substrate 400 may overlap the first organic light-emitting diode OLED1, the second organic light-emitting diode OLED2, and the third organic light-emitting diode OLED3.

The upper substrate 400 may include glass, a metal, and/or a polymer resin. The upper substrate 400 may be flexible and/or bendable, and may include a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The upper substrate 400 may have a multi-layered structure including two polymer layers and a barrier layer between the two polymer layers. The barrier layer may include an inorganic material, such as silicon oxide ($SiO_2$), silicon nitride ($SiN_x$), or silicon oxynitride (SiON).

The color filter layer 500 may be disposed on a lower surface of the upper substrate 400 and disposed between the upper substrate 400 and the lower substrate 100. The color filter layer 500 may include a first color filter 510, a second color filter 520, and a third color filter 530. The first color filter 510, the second color filter 520, and the third color filter 530 may be formed of one or more photosensitive resin materials. The first color filter 510, the second color filter 520, and the third color filter 530 may include dyes representing unique colors, respectively. The first color filter 510 may transmit only light having a wavelength in a range from about 630 nm to about 780 nm, the second color filter 520 may transmit only light having a wavelength in a range from about 495 nm to about 570 nm, and the third color filter 530 may transmit only light having a wavelength in a range from about 450 nm to about 495 nm.

The color filter layer 500 may reduce external light reflection of the display apparatus 1, When external light reaches the first color filter 510, only light within a preset wavelength range may pass through the first color filter 510; light outside the preset wavelength range may be absorbed by the first color filter 510. A portion of the transmitted light may be reflected by the opposite electrode 230 and/or the first pixel electrode 210R below the first color filter 510 and may be emitted back to the outside. Because only a portion of external light incident upon the first pixel PX1 is reflected to the outside, reflection of external light may be reduced. This description is analogously applicable to the second color filter 520 and the third color filter 530.

The first color filter 510, the second color filter 520, and the third color filter 530 may overlap one another and may form a light blocking portion BP. Without an additional light blocking member, the color filter layer 500 may prevent or reduce color mixing.

The third color filter 530 may be disposed directly on the upper substrate 400. The third color filter 530 may reduce reflectivity of the display apparatus 1 by absorbing a portion of the external light incident from the outside, and light reflected by the third color filter 530 is hardly visually recognized by a user.

The refractive layer RL may be disposed on the functional layer 700. The refractive layer RL may be disposed on each of a first functional layer 710, a second functional layer 720, and a third functional layer 730. The refractive layer RL may include an organic material. A refractive index of the refractive layer RL may be less than that of the first capping layer CL1. The refractive index of the refractive layer RL may be less than that of the color filter layer 500. The refractive layer RL may collect light.

The first capping layer CL1 may be disposed on the refractive layer RL and the color filter layer 500. The first capping layer CL1 may be between the color filter layer 500 and the functional layer 700. The first capping layer CL1 may protect the refractive layer RL and the color filter layer 500. The first capping layer CL1 may prevent the refractive layer RL and/or the color filter layer 500 from being significantly damaged or contaminated due to infiltration of impurities such as moisture and/or air from the outside. The first capping layer CL1 may include an inorganic material.

The banks 600 may be arranged on the first capping layer CL1. The banks 600 may include an organic material. The banks 600 may include a light blocking material and may function as a light blocking layer. The light blocking material may include at least one of a black pigment, a black dye, black particles, and metal particles.

The functional layer 700 may be between the banks 600. The functional layer 700 may include at least one of quantum dots and scatters. The functional layer 700 may include a first functional layer 710, a second functional layer 720, and a third functional layer 730.

The first functional layer 710 may overlap the first emission area EA1. A first pixel PX1 may include the first organic light-emitting diode OLED1 and the first functional layer 710.

The first functional layer 710 may convert the light in the first wavelength band generated by the portion of the emission layer 220 on the first pixel electrode 210R into light in a second wavelength band. For example, when the light having a wavelength in the range from about 450 nm to about 495 nm is generated by the portion of the emission layer 220 on the first pixel electrode 210R, the first functional layer 710 may convert the light into light having a wavelength in a range from about 630 nm to about 780 nm. Accordingly, in the first pixel PX1, the light having a wavelength in the range from about 630 nm to about 780 nm may be emitted to the outside through the upper substrate 400. The first functional layer 710 may include first quantum dots QD1, first scatterers SC1, and a first base resin BR1. The first quantum dots QD1 and the first scatterers SC1 may be dispersed within the first base resin BR1.

The second functional layer 720 may overlap the second emission area EA2. A second pixel PX2 may include the second organic light-emitting diode OLED2 and the second functional layer 720.

The second functional layer 720 may convert the light in the first wavelength band generated by the portion of the emission layer 220 on the second pixel electrode 210G into light in a third wavelength band. For example, when the light having a wavelength in the range from about 450 nm to about 495 nm is generated by the portion of the emission layer 220 on the second pixel electrode 210G, the second functional layer 720 may convert the light into light having a wavelength in a range from about 495 nm to about 570 nm. Accordingly, in the second pixel PX2, the light having a wavelength in the range from about 495 nm to about 570 nm may be emitted to the outside through the upper substrate 400. The second functional layer 720 may include second quantum dots QD2, second scatterers SC2, and a second base resin BR2. The second quantum dots QD2 and the second scatterers SC2 may be dispersed within the second base resin BR2.

The third functional layer 730 may overlap the third emission area EA3. A third pixel PX3 may include the third organic light-emitting diode OLED3 and the third functional layer 730.

The third functional layer 730 may emit the light generated by the portion of the emission layer 220 on the third pixel electrode 210B to the outside without wavelength conversion. For example, when the light having a wavelength in the range from about 450 nm to about 495 nm is generated by the portion of the emission layer 220 on the third pixel electrode 210B, the third functional layer 730 may emit the light to the outside without wavelength conversion. The third functional layer 730 may include third scatterers SC3 and a third base resin BR3. The third scatterers SC3 may be dispersed within the third base resin BR3. The third functional layer 730 may include no quantum dots.

The quantum dots QD1, the quantum dots QD2, or both of them may include a semiconductor material such as cadmium sulfide (CdS), cadmium telluride (CdTe), zinc sulfide (ZnS), or indium phosphide (InP). Quantum dots may have a size of several nanometers, and a wavelength of light after conversion may be affected by the size of the quantum dots.

Cores of the quantum dots may include at least one of a Group II-VI element-containing compound, a Group III-V element-containing compound, a Group IV-VI element-containing compound, a Group IV element, and a Group IV element-containing compound.

The Group II-VI element-containing compound may include at least one of the two-element compounds: CdSe, CdTe, ZnS, ZnSe, ZnTe, ZnO, HgS, HgSe, HgTe, MgSe, and MgS; at least one of the three-element compounds: AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS; and/or at least one of the four-element compounds: HgZnTeS, CdZnSeS, CdZnSeTe, CdZnSTe, CdHgSeS, CdHgSeTe, CdHgSTe, HgZnSeS, HgZnSeTe, and HgZnSTe.

The Group III-V element-containing compound may include at least one of the two-element compounds: GaN, GaP, GaAs, GaSb, AlN, AlP, AlAs, AlSb, InN, InP, InAs, and InSb; at least one of the three-element compounds: GaNP, GaNAs, GaNSb, GaPAs, GaPSb, AlNP, AlNAs, AlNSb, AlPAs, AlPSb, InGaP, InNP, InNAs, InNSb, InPAs, and InPSb; and/or at least one of the four-element compounds: GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb.

The Group IV-VI element-containing compound may include at least one of the two-element compounds: SnS, SnSe, SnTe, PbS, PbSe, and PbTe; at least one of the three-element compounds: SnSeS, SnSeTe, SnSTe, PbSeS, PbSeTe, PbSTe, SnPbS, SnPbSe, and SnPbTe; and/or at least one of the four-element compounds: SnPbSSe, SnPbSeTe, and SnPbSTe. The Group IV element may include Si and/or Ge. The Group IV element-containing compound may include at least one of the two-element compounds: SiC and SiGe.

The two-element compound, the three-element compound, or the four-element compound may be present in particles at a uniform concentration, or may have different concentration values in different parts of the same particle. A quantum dot may have a core-shell structure in which a shell surrounds a core. The concentration of elements in the shell may decrease toward the center of the shell.

A quantum dot may have a core-shell structure having a core and a shell. The core may include nano crystals. The shell may surround the core. The shell may serve as a protective layer for maintaining semiconductor properties by preventing chemical denaturation of the core and/or may serve as a charging layer for imparting electrophoretic properties to the quantum dot. The shell may be a single layer or a multi-layer structure. The concentration of elements in the shell may decrease toward the center of the shell. The shell may include oxide of a metal or a non-metal, and/or a semiconductor compound.

The oxide of the metal or the non-metal may include at least one of the two-element compounds: $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_{34}$, and NiO; and/or at least one of the three-element compounds: $MgAl_2O_4$, $CoFe_2O_4$, $NiFe_2O_4$, and $CoMn_2O_4$.

The semiconductor compound may include at least one of CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb.

Each of the quantum dots may have a full width of half maximum (FWHM) of an emission wavelength spectrum of about 45 nm or less, or about 40 nm or less, or about 30 nm or less; the quantum dot width may optimize color purity or color reproducibility. Light emitted through such quantum dots is emitted in all directions, and thus the viewing angle of the related image may be improved.

The shape(s) of the quantum dots may include one or more shapes of a sphere, a pyramid, a multi-arm structure, a cubic nanoparticle, a cubic nanotube, a cubic nanowire, a cubic nanofiber, and a cubic nanoplate particle.

The quantum dots may control the color of light according to particle sizes and may enable emission of blue light, red light, and green light.

The first scatterers SC1, the second scatterers SC2, and the third scatterers SC3 may scatter light so that more light may be emitted. The first scatterers SC1, the second scatterers SC2, and the third scatterers SC3 may increase light-output efficiency. At least one of the first scatterers SC1, the second scatterers SC2, and the third scatterers SC3 may include a metal and/or a metal oxide for evenly scattering light. For example, at least one of the first scatterers SC1, the second scatterers SC2, and the third scatterers SC3 may include at least one of $TiO_2$, $ZrO_2$, $Al_2O_3$, $In_2O_3$, ZnO, $SnO_2$, $Sb_2O_3$, and ITO. At least one of the first scatterers SC1, the second scatterers SC2, and the third scatterers SC3 may have a refractive index of 1.5 or more. Thus, the light-output efficiency of the functional layer 700 may be improved. At least one of the first scatterers SC1, the second scatterers SC2, and the third scatterers SC3 may be optional.

The first base resin BR1, the second base resin BR2, and the third base resin BR3 may be light-transmissive materials. For example, at least one of the first base resin BR1, the second base resin BR2, and the third base resin BR3 may include a polymer resin, such as acryl, benzocyclobutene (BCB), or hexamethyldisiloxane (HMDSO).

The second capping layer CL2 may be disposed on the banks 600 and the functional layer 700. The second capping layer CL2 may protect the banks 600 and the functional layer 700. The second capping layer CL2 may be disposed on the dummy unit IDZ. The second capping layer CL2 may protect the dummy unit IDZ. The second capping layer CL2 may prevent the banks 600, the functional layer 700, and the dummy unit IDZ from being significantly damaged or contaminated due to infiltration of impurities such as moisture and/or air from the outside. The second capping layer CL2 may include an inorganic material.

A spacer may be arranged on the second capping layer CL2. The spacer may maintain a distance between the display panel 10 and the color converting panel 20.

A filler 800 may be disposed between the display panel 10 and the color converting panel 20. The filler 800 may function as a buffer against external pressure, etc. The filler 800 may include an organic material, such as methyl silicone, phenyl silicone, or polyimide. The filler 800 may include an organic sealant, such as a urethane-based resin, an epoxy-based resin, or an acrylic resin, or an inorganic sealant, such as silicon.

In the display apparatus 1, light in the second wavelength band may be emitted from the first pixel PX1 to the outside, light in the third wavelength band may be emitted from the second pixel PX2 to the outside, and light in the first wavelength band may be emitted from the third pixel PX3 to the outside. The display apparatus 1 may display a full-color image.

Figure 5:
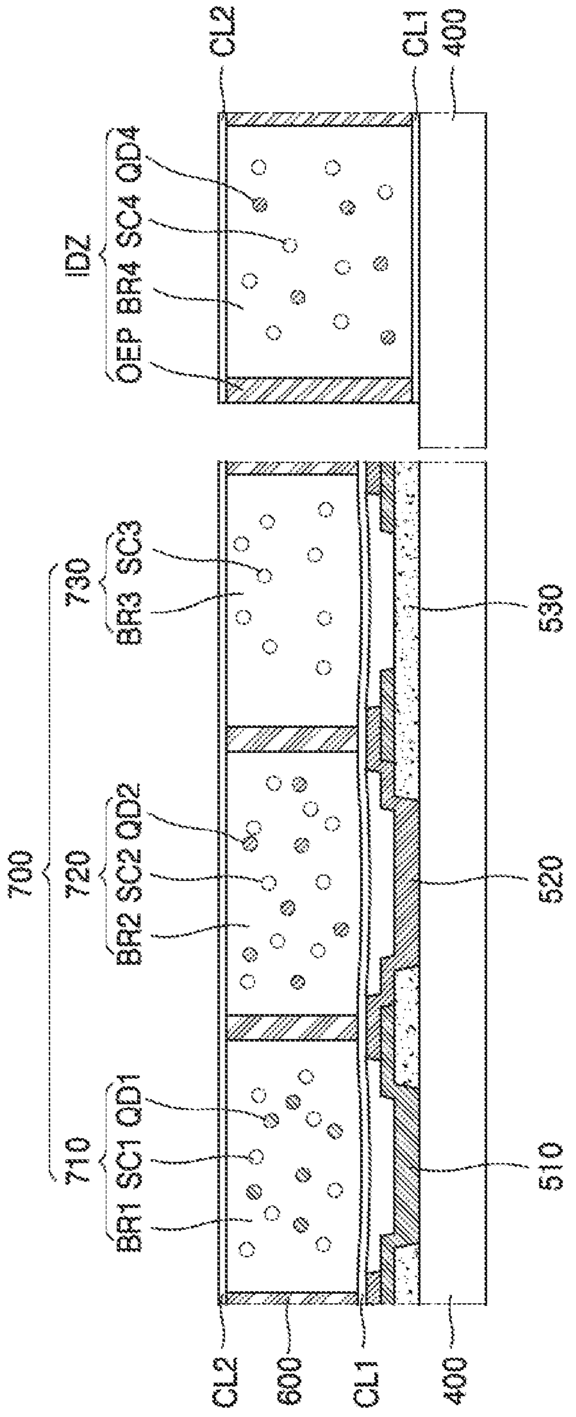
FIG. 5 is a schematic cross-sectional view of a portion of a display apparatus according to an embodiment.

FIG. 5 is a schematic cross-sectional view of a portion of a display apparatus according to an embodiment. Some features illustrated in FIG. 5 are described with reference to one or more of FIG. 1, FIG. 2, FIG. 3, and FIG. 4.

Referring to FIG. 1 and FIG. 5, in the display area DA, the first capping layer CL1, the functional layer 700 surrounded by the plurality of banks 600, and the second capping layer CL2 may overlap one another and may be disposed on the upper substrate 400. The functional layer 700 may include the first functional layer 710, the second functional layer 720, and the third functional layer 730. The first functional layer 710 may include the first quantum dots QD1, the first scatterers SC1, and the first base resin BR1.

In the peripheral area PA, the first capping layer CL1, the dummy unit IDZ, and the second capping layer CL2 may overlap one another and may be disposed on the upper substrate 400. The dummy unit IDZ may include an external partition wall OEP (or surrounding wall OEP), dummy-scatterers SC4 (or dummy-unit scatterers SC4), and a dummy-base resin BR4 (or dummy-unit base resin BR4).

Some of the dummy-scatterers SC4 may be the same as the first scatterers SC1, some of the dummy-scatterers SC4 may be the same as the second scatterers SC2, and some of the dummy-scatterers SC4 may be the same as the third scatterers SC3. A concentration of the dummy-scatterers SC4 in the dummy-base resin BR4 may be greater than each of a concentration of the first scatterers SC1 in the first base resin BR1, a concentration of the second scatterers SC2 in the second base resin BR2, and a concentration of the third scatterers SC3 in the third base resin BR3.

Without the dummy unit IDZ, at the beginning of an inkjet process, if an undesirably large amount of $TiO_x$ is discharged at once from a printing head to an edge portion of the display area DA, corner stains or yellowing stains may be generated. Given the dummy unit IDZ, when printing starts, a large amount of $TiO_x$ accumulated in the printing head may be discharged at once to a space surrounded and confined by the external partition wall OEP of the dummy unit IDZ, and then $TiO_x$ of a uniform concentration may be provided in the functional layer 700 of the display area DA. As a result, the concentration of the dummy-scatterers SC4 in the dummy-base resin BR4 may be greater than a concentration of the scatterers in a base resin of the functional layer 700, and unwanted corner stains or yellowing stains in the display area DA may be prevented or minimized.

The dummy unit IDZ may include the external partition wall OEP, dummy-quantum dots QD4, dummy-scatterers SC4, and the dummy-base resin BR4. The dummy-quantum dots QD4 may include quantum dots of the same type as the first quantum dots QD1 included in the first functional layer 710. A concentration of the dummy-quantum dots QD4 in the dummy-base resin BR4 may be greater than the concentration of the first quantum dots QD1 in the first base resin BR1.

The dummy-quantum dots QD4 may include quantum dots of the same type as the second quantum dots QD2 included in the second functional layer 720. The concentration of the dummy-quantum dots QD4 in the dummy-base resin BR4 may be greater than the concentration of the second quantum dots QD2 in the second base resin BR2. The dummy-quantum dots QD4 may include the same types of quantum dots as both the first quantum dots QD1 and the second quantum dots QD2.

Figure 6:
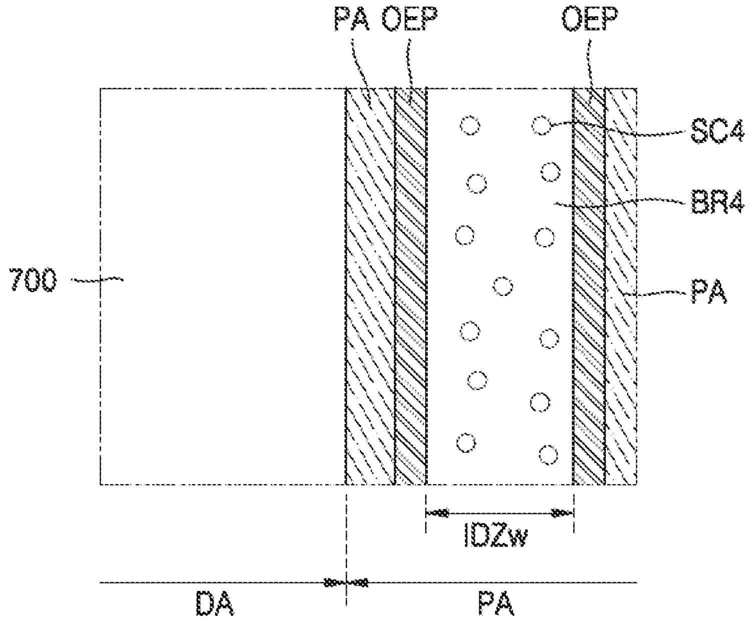
FIG. 6 is a schematic plan view of a portion of a display apparatus according to an embodiment.
Figure 7:
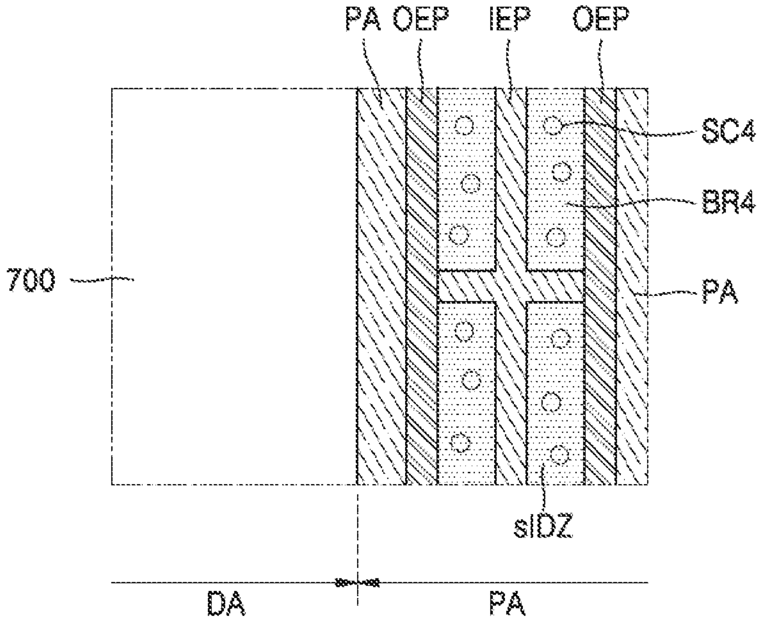
FIG. 7 is a schematic plan view of a portion of a display apparatus according to an embodiment.
Figure 8:
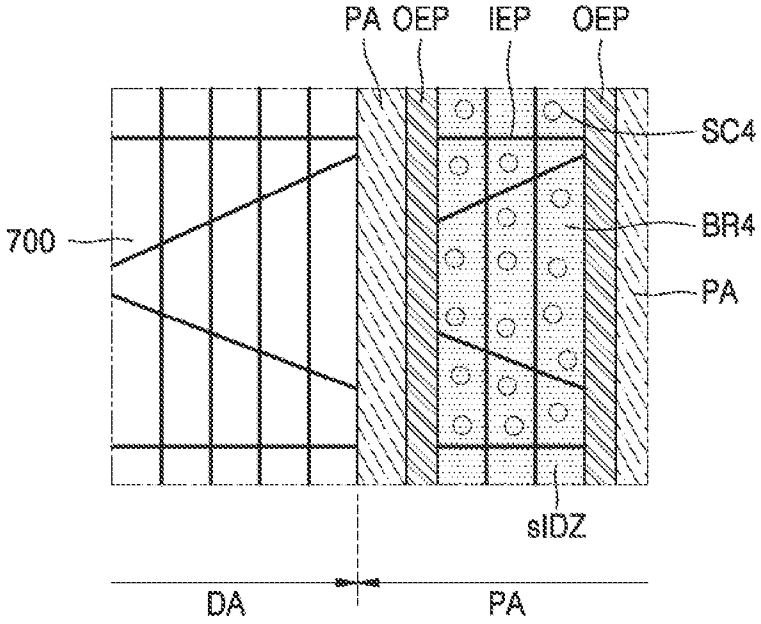
FIG. 8 is a schematic plan view of a portion of a display apparatus according to an embodiment.

Each of FIG. 6, FIG. 7, and FIG. 8 is a schematic plan view of a region B of the display apparatus 1 shown in FIG. 1 according to one or more embodiments. Some features illustrated in FIGS. 6 through 8 are described with reference to one or more of FIGS. 1 through 5.

Referring to FIG. 5 and FIG. 6, the display apparatus 1 may include the functional layer 700 in the display area DA. The functional layer 700 may include the first functional layer 710, the second functional layer 720, and the third functional layer 730. The display apparatus 1 may include the dummy unit IDZ in the peripheral area PA.

The dummy unit IDZ may include an external partition wall OEP. The external partition wall OEP may be disposed in the peripheral area PA of the upper substrate 400. The external partition wall OEP may directly contact the same second capping layer CL2 as the banks 600, and may include the same material as the banks 600. The external partition wall OEP may include an organic material. The external partition wall OEP may include a light blocking material and may function as a light blocking layer. The light blocking material may include at least one of a black pigment, a black dye, black particles, and metal particles. The greater a width IDZw of the containing space the dummy unit IDZ has, the more defective ink is collected by the dummy unit IDZ, and thus a stain removal effect may be excellent, Limited by the peripheral area PA of the display apparatus 1, the width IDZw of the containing space of the dummy unit IDZ may be 1 mm to 10 mm, and defective ink may be sufficiently collected. When a wide peripheral area PA is given, the width IDZw of the dummy unit IDZ may be configured accordingly.

Referring to FIG. 7, an internal partition wall IEP may be provided inside the dummy unit DZ. The dummy unit IDZ may include sub-dummy units sIDZ divided by the internal partition wall IEP. The sub-dummy units sIDZ may have smaller widths than the dummy unit IDZ. Accordingly, a center portion of the dummy unit IDZ may not be made convex by the surface tension of collected ink, and the collected ink may be substantially evenly spread.

Referring to FIG. 8, at least one of the sub-dummy units sIDZ may have the same shape and area as those of the first functional layer 710. The internal partition wall IEP may allow a region surrounded by the external partition wall OEP to have the same shape as a portion of a pixel shape associated with the first functional layer 710. An additional process of dividing the region surrounded by the external partition wall OEP into a shape different from that of the inside of the first functional layer 710 is not needed, and thus a process of forming the dummy unit IDZ may be simplified. At least one of the sub-dummy units sIDZ may have the same shape and area as those of the second functional layer 720 and/or the third functional layer 730.

Figure 9:
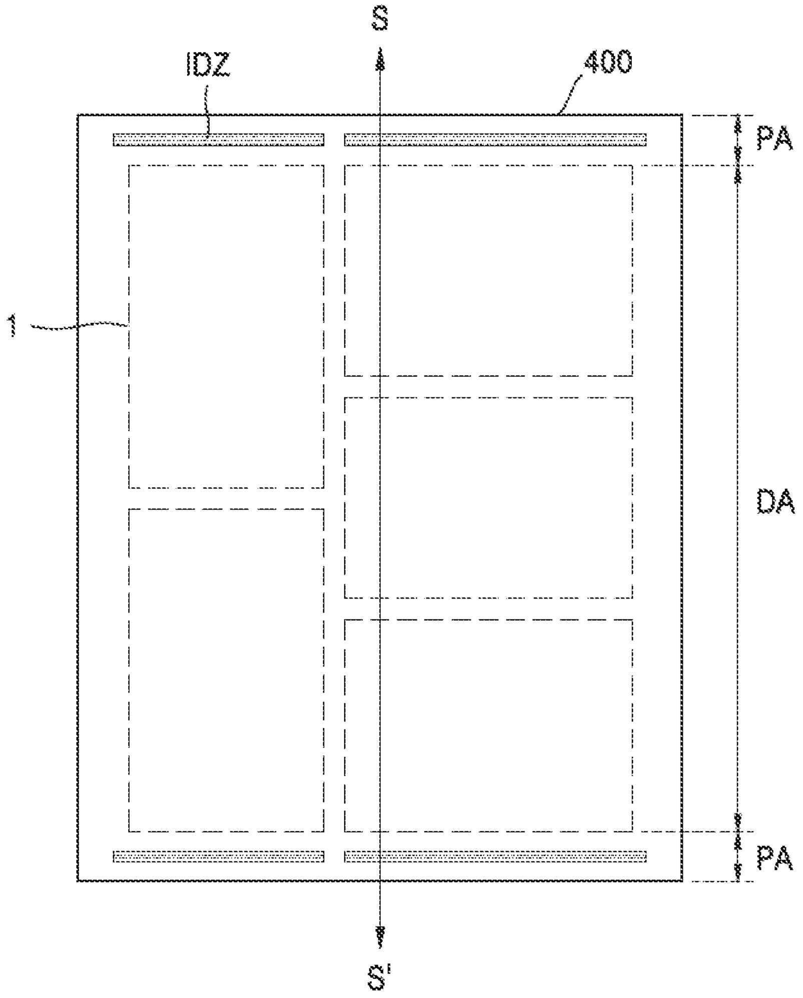
FIG. 9 is a schematic plan view of a display apparatus according to an embodiment.
Figure 10:
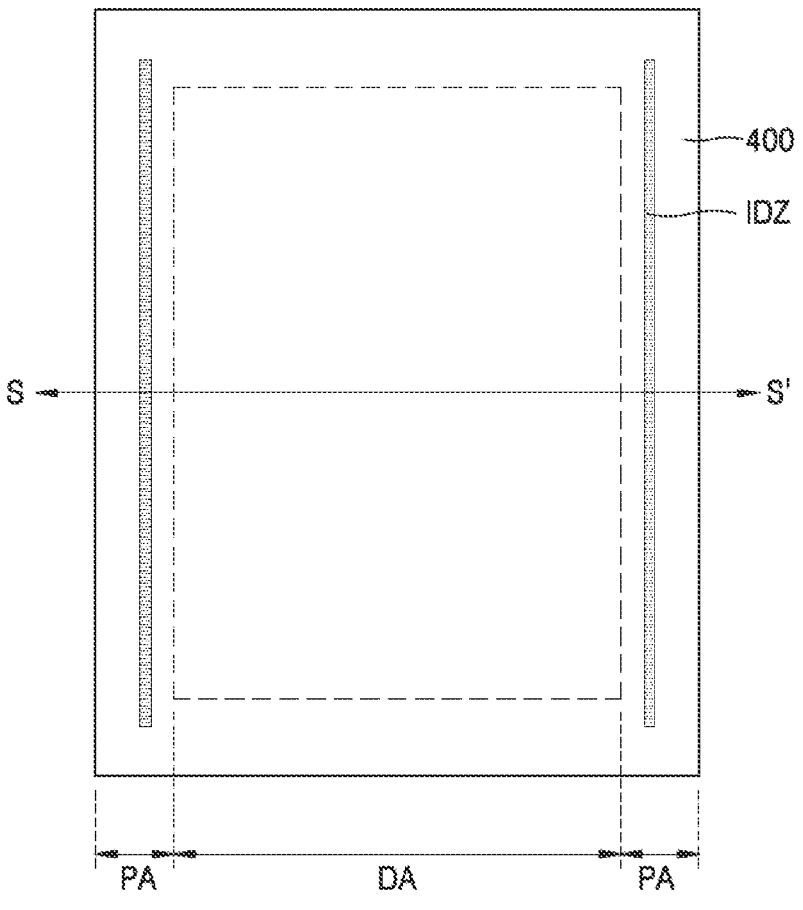
FIG. 10 is a schematic plan view of a display apparatus according to an embodiment.

Each of FIGS. 9 and 10 is a schematic plan view of the display apparatus 1 according to an embodiment. Some features illustrated in FIGS. 9 and 10 are described with reference to one or more of FIGS. 1 to 8.

Referring to FIGS. 9 and 10, dummy units IDZ may be disposed in the peripheral area PA of the upper substrate 400. Line S-S' shows a scanning direction of an inkjet process for forming the functional layer 700. Each of dummy units IDZ may extend in a direction perpendicular to line S-S'. The dummy units IDZ and a plurality of display apparatuses 1 may be arranged along the line S-S'. Dummy units IDZ may be positioned at opposite sides of one or more display apparatuses 1. Dummy units IDZ may be connected to one another, may be integrally formed with each other, and may be positioned between display apparatuses 1.

Figure 11A:
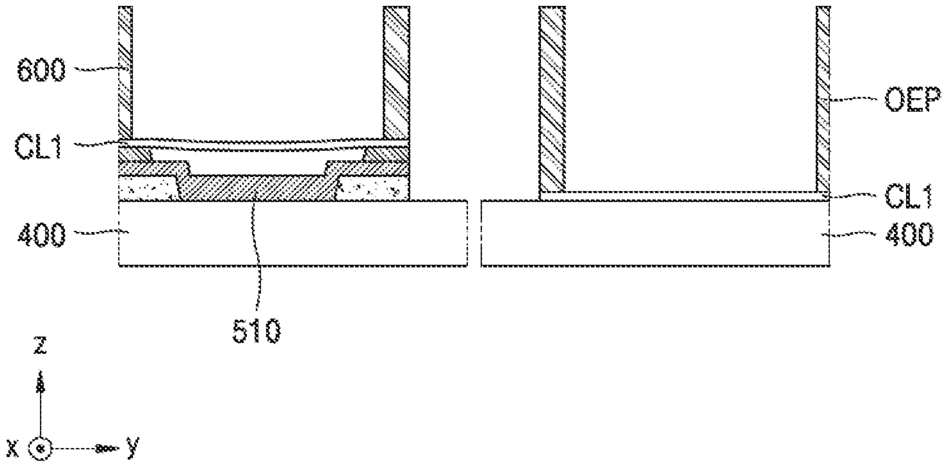
FIG. 11A, FIG. 11B, and FIG. 11C are cross-sectional views illustrating structures associated with a process of forming a dummy unit of a display apparatus according to one or more embodiments.
Figure 11B:
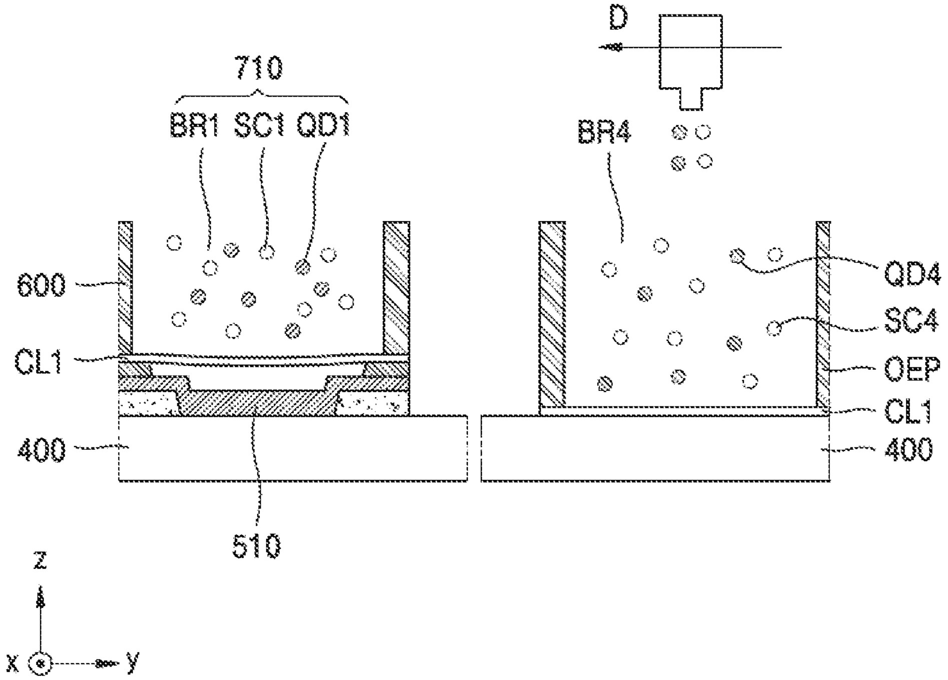
Figure 11C:
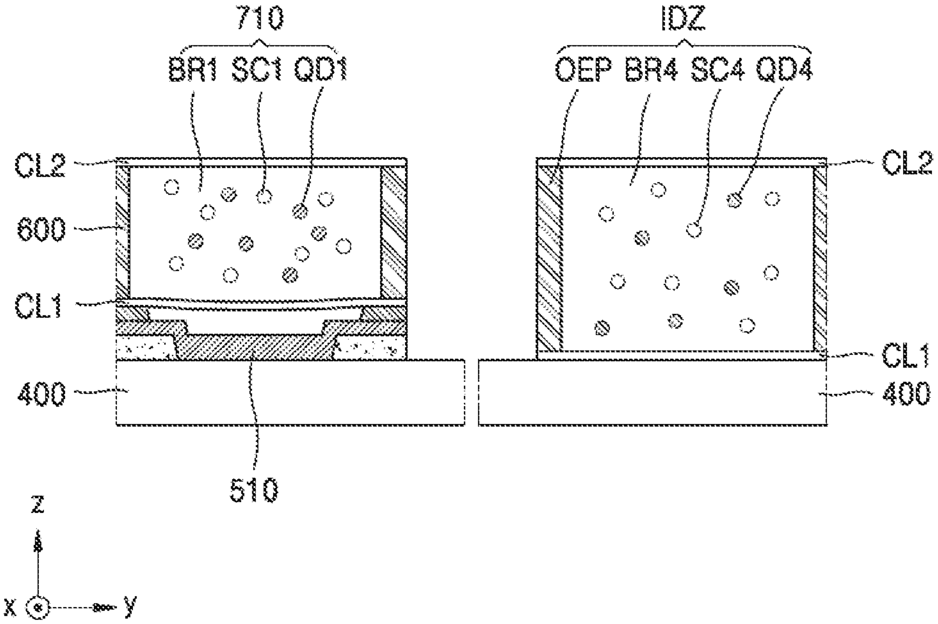

FIG. 11A, FIG. 11B, and FIG. 11C are cross-sectional views illustrating structures associated with a method of manufacturing the display apparatus 1 according to an embodiment. Some features illustrated in FIGS. 11A through 11C are described with reference to one or more of FIGS. 1 to 10.

Referring to FIG. 11A, the first capping layer CL1 may be formed on the upper substrate 400. Subsequently, the external partition wall OEP and the banks 600 may be formed on the first capping layer CL1. The external partition wall OEP and the banks 600 may be simultaneously formed in the same process. The external partition wall OEP and the banks 600 may be formed by depositing an organic material on the first capping layer CL1 and then performing exposure, development, and curing on the organic material. The external partition wall OEP may be disposed on the first capping layer CL1 in the peripheral area PA of the upper substrate 400. The banks 600 may be disposed on the first capping layer CL1 in the display area DA of the upper substrate 400. The external partition wall OEP and the banks 600 may include a light blocking material and may function as light blocking members. The light blocking material may include at least one of a black pigment, a black dye, black particles, and metal particles.

Subsequently, referring to FIG. 11B, the dummy unit IDZ and the functional layer 700 may be formed by moving the printing head in the direction D to deposit ink including scatterers in the region surrounded by the external partition wall OEP and subsequently in regions confined by the banks 600. The ink may include quantum dots, the scatterers, and a base resin, and may be discharged using an inkjet method. The dummy unit IDZ may include the external partition wall OEP, the dummy-quantum dots QD4, the dummy-scatterers SC4, and the dummy-base resin BR4.

The dummy unit IDZ may be formed before the functional layer 700 is formed. Ink may be provided to the region surrounded by the external partition wall OEP before any ink is provided between the banks 600. Defective ink may be collected in the dummy unit IDZ and confined by the external partition wall OEP, and thus corner stains and yellowing stains in the display area DA may be prevented or minimized.

The functional layer 700 may include the first functional layer 710, the second functional layer 720, and the third functional layer 730. FIG. 11B illustrates a process of forming the first functional layer 710. The first functional layer 710 may include the first quantum dots QD1, the first scatterers SC1, and the first base resin BR1. The second functional layer 720 may include the second quantum dots QD2, the second scatterers SC2, and the second base resin BR2. The third functional layer 730 may include the third scatterers SC3 and the third base resin BR3. The third functional layer 730 may include no quantum dots and may serve as a transmissive layer.

In an inkjet process, ink including scatterers may be discharged to the region surrounded by the external partition wall OEP before being discharged to a region surrounded by the banks 600. Thus, the concentration of the dummy-scatters SC4 in the dummy-base resin BR4 may be greater than the concentration of the first scatters SC1 in the first base resin BR1. This is analogously applied to the second scatterers SC2 of the second functional layer 720 and/or the third scatterers SC3 of the third functional layer 730.

Without dummy units IDZ in the inkjet process, $TiO_x$ deposited/accumulated inside the printing head may be discharged all at once at an edge or corner of the display area DA, and thus a undesirable difference in $TiO_x$ concentration may occur in the display area DA. Given the dummy unit IDZ, the $TiO_x$ deposited/accumulated inside the printing head may be discharged all at once to the region surrounded by the external partition wall OEP, and thus the region surrounded by the banks 600 may be prevented from including defective ink. Accordingly, the defective ink may not be significantly included in the display area DA, and thus corner stains and yellowing stains in the display area DA may be prevented or minimized.

The dummy unit IDZ may include the dummy-quantum dots QD4. When the dummy-quantum dots QD4 are of the same type as the first quantum dots QD1, the concentration of the dummy-quantum dots QD4 in the dummy-base resin BR4 may be greater than the concentration of the first quantum dots QD1 in the first base resin BR1.

When the dummy-quantum dots QD4 are of the same type as the second quantum dots QD2, the concentration of the dummy-quantum dots QD4 in the dummy-base resin BR4 may be greater than the concentration of the second quantum dots QD2 in the second base resin BR2.

Referring to FIG. 11C, the second capping layer CL2 may protect the banks 600 and the functional layer 700. The second capping layer CL2 may be disposed on the dummy unit IDZ. The second capping layer CL2 may protect the dummy unit IDZ. The second capping layer CL2 may prevent the banks 600, the functional layer 700, and the dummy unit IDZ from being significantly damaged or contaminated due to infiltration of impurities such as moisture and/or air from the outside. The second capping layer CL2 may include an inorganic material.

Figure 12A:
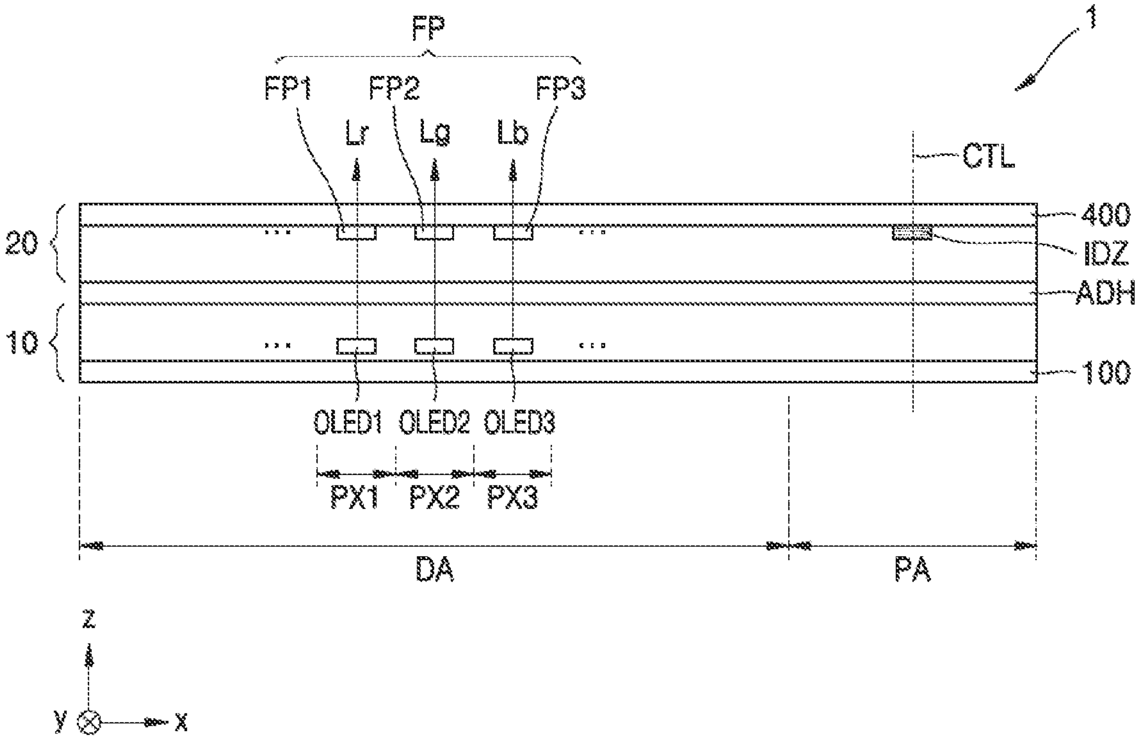
FIG. 12A, FIG. 12B, and FIG. 12C are cross-sectional views illustrating structures related to a process of cutting a dummy unit of a display apparatus according to one or more embodiment.
Figure 12B:
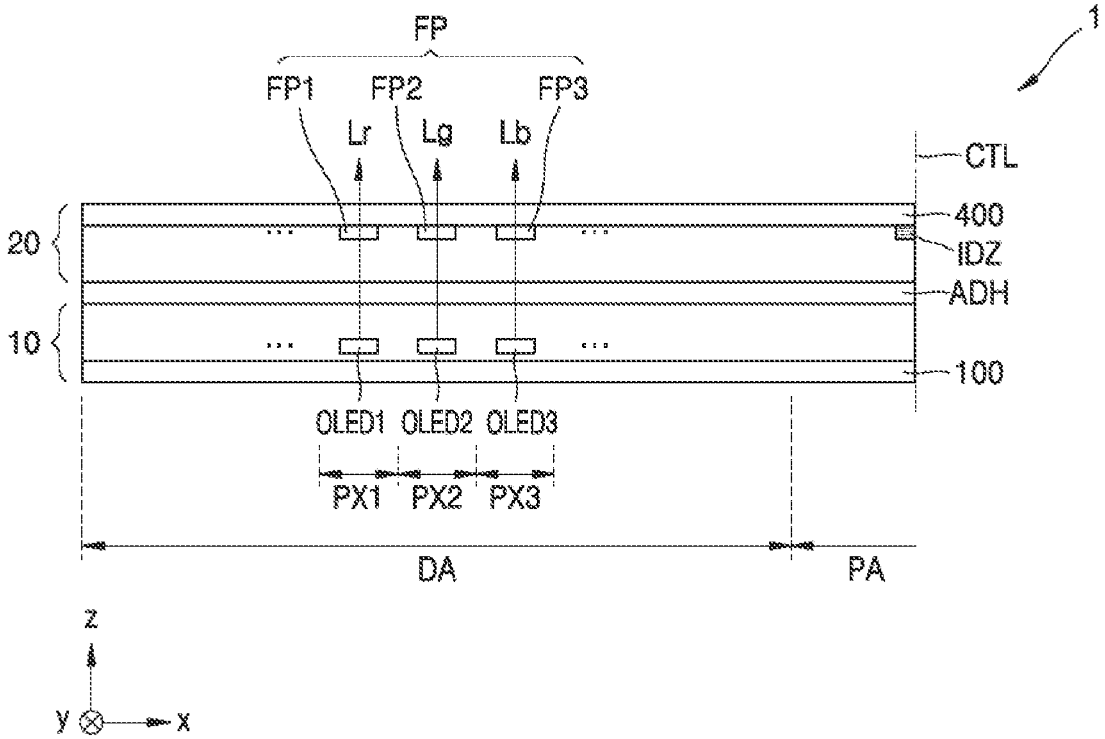
Figure 12C:
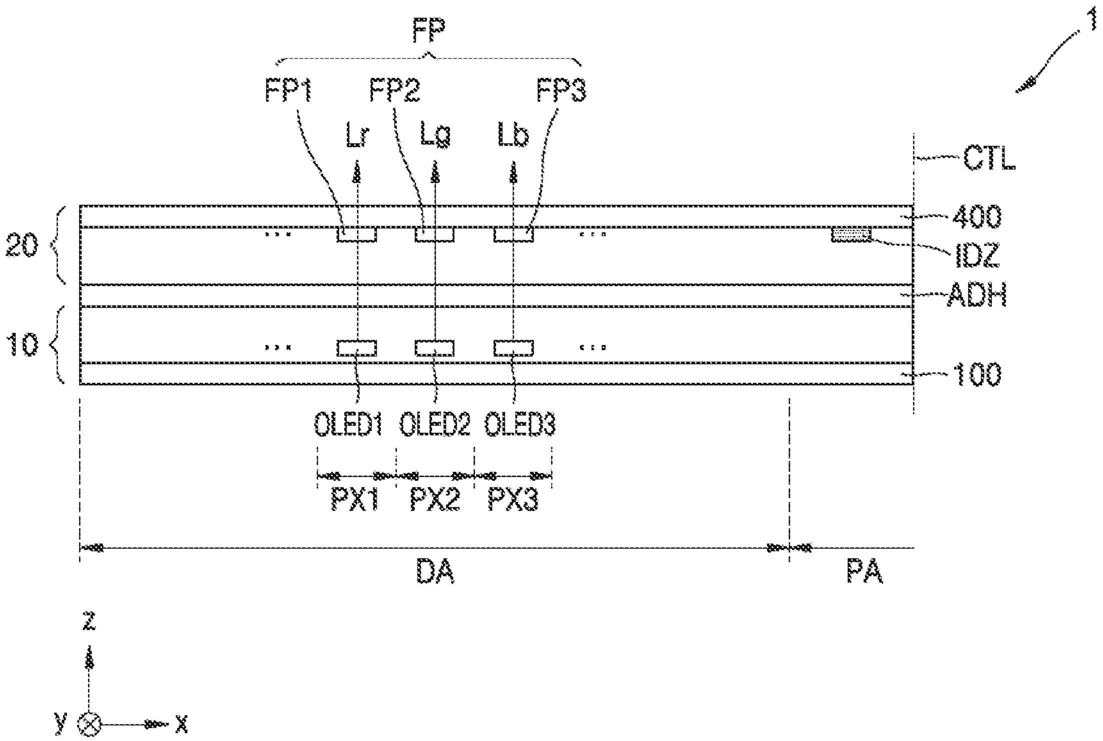

Each of FIG. 12A, FIG. 12B, and FIG. 12C is a cross-sectional view illustrating a process of cutting the substrates of the display apparatus 1 according to an embodiment. Some features illustrated in FIGS. 12A through 12C are described with reference to one or more of FIGS. 1 to 11.

Referring to FIGS. 12A through 12C, the cutting line CTL is an imaginary surface along which a portion or the entirety of the peripheral area PA may be removed. After the lower substrate 100 and the upper substrate 400 are bonded with each other, the peripheral area PA may be cut along the cutting line CTL.

The dummy unit IDZ may be formed outside the cutting line CTL on the peripheral area PA of the upper substrate 400. When the display apparatus 1 is cut along the cutting line CTL, the dummy units IDZ may be completely removed. The dummy unit IDZ may overlap with the cutting line CTL on the peripheral area PA of the upper substrate 400. The dummy unit IDZ may be partially removed and may partially remain after the display apparatus 1 is cut. The dummy unit IDZ may be formed between the display area DA and the cutting line CTL. The dummy unit IDZ may substantially or completely remain on the lower surface of the upper substrate 400 even after the display apparatus 1 is cut along the cutting line CTL. As the dummy unit IDZ is arranged close to the display area DA, the dummy unit IDZ may be utilized even when the upper substrate 400 has a small planar width.

Simultaneously with a process of forming the banks 600 and the external partition wall OEP, the internal partition wall IEP (for dividing the region surrounded by the external partition wall OEP) may be formed. The internal partition wall IEP may include an organic material. The internal partition wall IEP may include a light blocking material and may function as a light blocking layer. The light blocking material may include at least one of a black pigment, a black dye, black particles, and metal particles. The internal partition wall IEP may divide the region surrounded by the external partition wall OEP into the sub-dummy units sIDZ, for the discharged ink to be substantially evenly spread.

At least one of the sub-dummy units sIDZ may have the same shape as a portion of the pixel shape within at least one of the first functional layer 710, the second functional layer 720, or the third functional layer 730. An additional process of dividing the internal region of the dummy unit IDZ into a shape different from that of the inside of the first functional layer 710 is not needed, and thus a process of forming the dummy unit IDZ may be simplified.

According to embodiments, corner stains and yellowing stains in a display area of a display apparatus may be advantageously prevented or minimized.

The described embodiments should be considered in an illustrative sense and not for purposes of limitation. Descriptions of features or aspects within each embodiment should typically be considered as available for other similar features or aspects in other embodiments. While embodiments have been described with reference to the figures, various changes in form and details may be made in the described embodiments without departing from the scope defined by the following claims.

What is claimed is:

1. A display apparatus comprising:

a substrate;

a first display element disposed under a face of the substrate;

a first bank;

a first functional layer overlapping the first display element, confined by at least the first bank, and comprising a first base resin, first quantum dots, and first scatterers;

a first color filter overlapping the first functional layer;

a dummy unit overlapping no display elements in a direction perpendicular to the face of the substrate, and comprising a first wall, a dummy-unit base resin, and dummy-unit scatterers; and a first cover layer including an inorganic material and directly contacting the dummy unit on a first surface, wherein the dummy-unit base resin and the dummy-unit scatterers are confined by at least the first wall, and a concentration of the dummy-unit scatterers in the dummy-unit base resin is greater than a concentration of the first scatterers in the first base resin, and wherein no color filter of the display apparatus is disposed between the dummy unit and the substrate, and the first cover layer further includes a second surface which is opposite to the first surface and directly contacting the substrate.

2. The display apparatus of claim 1, further comprising an internal partition wall that divides the dummy unit into sub-dummy units.

3. The display apparatus of claim 2, wherein a shape and an area of at least one of the sub-dummy units are the same as a shape and an area of the first functional layer in a plan view of the display device.

4. The display apparatus of claim 1, wherein the dummy unit has a rectangular shape in a plan view of the display apparatus.

5. The display apparatus of claim 4, wherein the first functional layer is disposed between the first display element and the substrate, wherein the dummy unit comprises an opening, and wherein the opening is positioned at an edge of the substrate.

6. The display apparatus of claim 1, further comprising:

a second display element;

a third display element;

a second functional layer overlapping the second display element and comprising a second base resin, second quantum dots, and second scatterers; and a third functional layer overlapping the third display element and comprising a third base resin and third scatterers, wherein the concentration of the dummy-unit scatterers in the dummy-unit base resin is greater than at least one of a concentration of the second scatterers in the second base resin and a concentration of the third scatterers in the third base resin.

7. The display apparatus of claim 1, wherein the dummy unit comprises dummy-unit quantum dots, and wherein a concentration of the dummy-unit quantum dots in the dummy-unit base resin is greater than a concentration of the first quantum dots in the first base resin.

8. The display apparatus of claim 1, further comprising a second display element, wherein no intervening display elements are positioned between the first display element and the second display element, wherein the second display element emits light of a same color as the first display element.

9. The display apparatus of claim 1, wherein the first cover layer is disposed between the substrate and the first functional layer and between the substrate and the dummy unit, and wherein the first functional layer is disposed between the first display element and the substrate.

10. The display apparatus of claim 9, further comprising a second cover layer disposed directly on each of the first functional layer and the dummy unit.

* * * * *